(12) United States Patent
Meyer (10) Patent No.: US 12,140,066 B2
(45) Date of Patent: Nov. 12, 2024

(54) SYSTEM FOR CONVERTING MOTOR VEHICLE WASTE HEAT TO USEFUL ENERGY

(71) Applicant: Katherine Anna Meyer, Hamilton, OH (US)

(72) Inventor: Katherine Anna Meyer, Hamilton, OH (US)

( * ) Notice: Subject to any disclaimer, the term of this patent is extended or adjusted under 35 U.S.C. 154(b) by 0 days.

(21) Appl. No.: 17/821,830

(22) Filed: Aug. 24, 2022

(65) Prior Publication Data

US 2024/0068391 A1    Feb. 29, 2024

(51) Int. Cl.
*F01N 5/02* (2006.01)
*H10N 10/13* (2023.01)

(52) U.S. Cl.
CPC .............. *F01N 5/025* (2013.01); *H10N 10/13* (2023.02)

(58) Field of Classification Search
CPC .................................. F01N 5/025; H10N 10/13
See application file for complete search history.

(56) References Cited

U.S. PATENT DOCUMENTS

| | | | | |
|---|---|---|---|---|
| 2,391,994 A * | 1/1946 | Mccollum | .............. | H10N 10/00 244/134 D |
| 6,148,656 A * | 11/2000 | Breton | ................. | G01M 15/102 73/23.31 |
| 6,593,725 B1 * | 7/2003 | Gallagher | ............. | H02M 3/156 323/275 |
| 8,793,992 B2 * | 8/2014 | Schamp | ................... | F02G 1/043 136/211 |
| 2003/0223919 A1 * | 12/2003 | Kwak | ................ | B01D 53/9445 422/177 |
| 2005/0268598 A1 * | 12/2005 | Yang | ....................... | F01N 5/025 60/285 |
| 2008/0054645 A1 * | 3/2008 | Kulkarni | ................. | F02C 7/266 290/52 |
| 2010/0060231 A1 * | 3/2010 | Trainor | .................. | H01G 11/14 320/103 |
| 2010/0146949 A1 * | 6/2010 | Stobart | ................... | F01N 5/025 60/517 |
| 2021/0179060 A1 * | 6/2021 | McDowell | ............... | B60K 6/46 |

FOREIGN PATENT DOCUMENTS

| | | | | |
|---|---|---|---|---|
| DE | 102008023806 A1 | * | 11/2009 | ............. F01N 13/02 |
| JP | 2004360522 A | * | 12/2004 | ........... F01N 13/009 |

OTHER PUBLICATIONS

Machine translation of DE-102008023806-A1 (Year: 2009).*
Machine translation of JP2004360522A (Year: 2004).*

* cited by examiner

*Primary Examiner* — Tamir Ayad
(74) *Attorney, Agent, or Firm* — Peter D. Meyer; Larry L. Huston (57) ABSTRACT

The present disclosure provides for a system for converting motor vehicle waste heat into useful energy. The system provides a motor vehicle having a vehicle electrical system, a heat source, and at least one passive electromotive force (EMF) generator. The heat source has an exhaust stream and the at least one passive EMF generator generates an EMF when the passive EMF generator is operably and fluidly coupled to the exhaust stream. At least a portion of the EMF is operatively and electrically coupled to an input of the vehicle electrical system of the motor vehicle.

16 Claims, 7 Drawing Sheets

SYSTEM FOR CONVERTING MOTOR VEHICLE WASTE HEAT TO USEFUL ENERGY

FIELD OF THE INVENTION

The present disclosure relates to a system for the conversion of waste heat produced by engines into useful energy. In particular, the present disclosure provides a passive system that converts engine waste heat into an EMF that can be used to power numerous vehicle electrical systems and devices and substantially reduce the need for fossil fuels that create unnecessary $CO_2$ emissions.

BACKGROUND OF THE INVENTION

Automobiles, airplanes, ships, trucks, and the like utilize vast amounts of fossil fuels to provide the power necessary to operate. For example, In 2019, U.S. gasoline and gasohol consumption from motor vehicles amounted to some 146 billion gallons. The global fuel consumption by commercial airlines increased each year since 2009 and reached an all-time high of 95 billion gallons in 2019. The world's 90,000 vessels burn approximately 370 million tons of fuel per year emitting 20 million tons of Sulphur Oxides. Argonne National Laboratory (Argonne) estimates that, in the U.S., rest-period truck idling consumes up to 1 billion gallons of fuel annually at a cost of around $3 billion.

All of this fuel is typically used by an internal combustion engine that converts the fuel into useful energy that propels the vehicle and provides the necessary power to operate all of the associated ancillary systems. This can include the engine itself, fuel supply systems, the transmission, electrical systems, cooling and lubrication systems, and the chassis, which includes the suspension system, braking system, wheels and tires, and the body.

Figure 1:
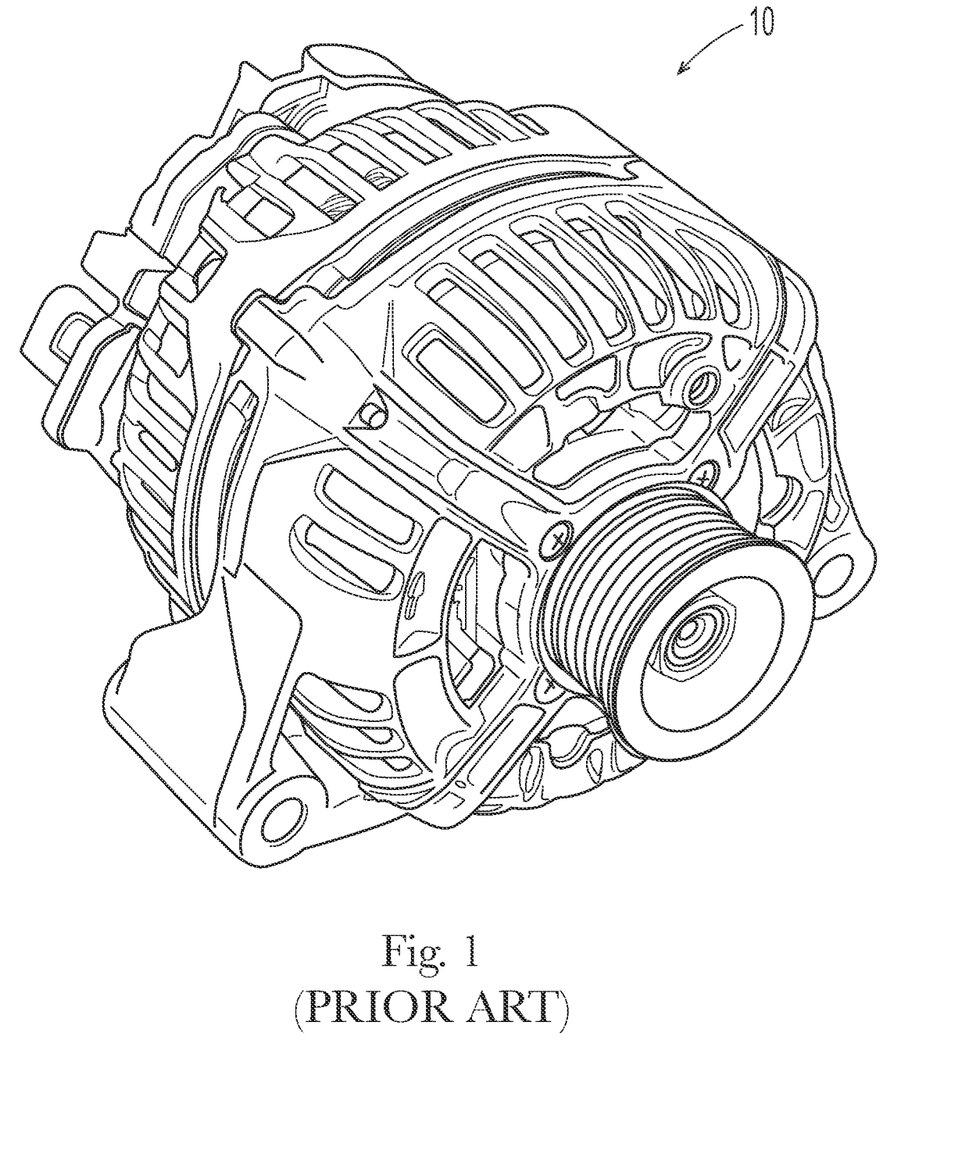
FIG. 1. is a photograph of an exemplary prior art alternator.

The power to operate these ancillary systems is usually created by an alternator. As shown in FIG. 1, an alternator 10 (generator) is a type of electric generator used in modern automobiles to charge the battery and to power the electrical system when its engine is running. While a battery is essential for starting the engine, the alternator 10 powers the electronic components while driving or idling, including headlights, electric steering, power windows, windshield wipers, heated seats, dashboard instruments, and radio. The alternator 10 generates an alternating current that must be converted to a direct current (DC) to supply all of these devices with direct current (DC) power. The alternator 10 also charges the car battery while it is in operation.

The alternator 10 works by turning mechanical energy into electrical energy. An alternator 10 uses the engine's rotational power to spin magnets mounted within a field coil, which produces the alternating current (AC) EMF. In other words, an alternator 10 works on the principle that when a magnetic field around a conductor varies, a current is induced in the conductor.

Figure 2:
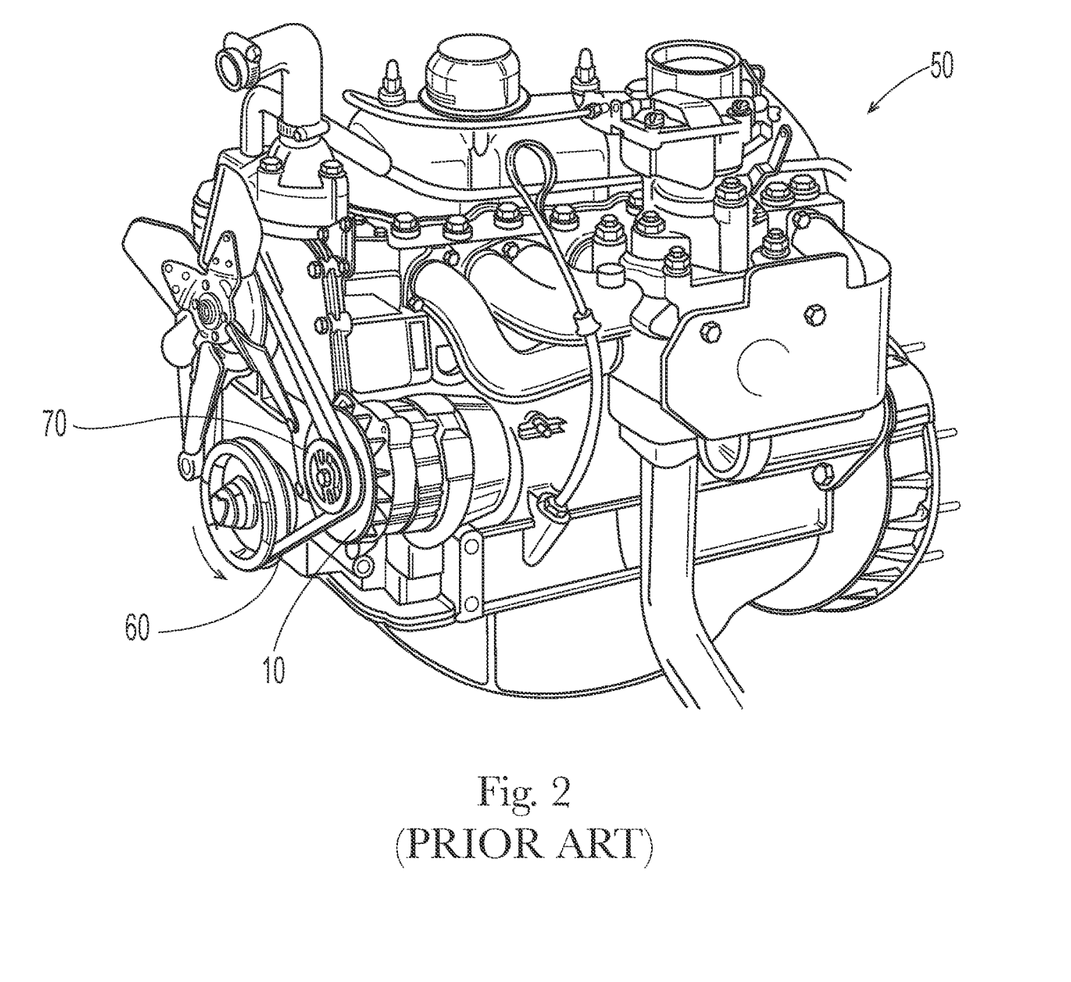
FIG. 2 is a perspective view of an exemplary prior art engine.

Referring to FIG. 2, operationally, when the engine 50 is on, it powers a drive belt 60 that rests on a pulley 70 attached to the alternator 10. The pulley 70 turns the alternator 10 rotor shaft, which spins a set of magnets around a coil. These spinning magnets generate alternating current (AC) around the coil, which is then channeled to a rectifier (not shown). The rectifier converts that AC power into DC power, which activates the car's electrical systems.

Stated differently, the alternator 10 requires an operational engine 50 to operate. As the alternator 10 provides yet another load, the engine 50 must create yet more power to operate the alternator 10. When the engine 50 requires more power to operate, fuel consumption increases.

The US uses about 146 billion gallons of gasoline every year. Every gallon of gasoline burned creates about 8.9 Kg of $CO_2$. The U.S. uses about 3.8 billion gallons of diesel fuel every year. One gallon of diesel fuel produces about 10.2 Kg of $CO_2$ are produced by burning a gallon of diesel fuel. the US uses about 10.3 billion gallons of jet fuel every year. Jet fuel produces 9.5 Kg of $CO_2$ emissions per gallon burned. This amounts to approximately 1.44 trillion ($1.44 \times 10^{11}$) Kg of $CO_2$ produced every year!

To put this massive number in perspective, if only 10 percent of this total emission were reduced as a result of modifying an internal combustion engine to provide a power generating device other than an alternator 10 to generate power for the vehicle, this would be equivalent to removing 31.2 million cars (each creating 4,600 Kg $CO_2$) from the roads.

Accordingly, there continues to be a need for a new environmentally-friendly system suitable for the generation of power for use by vehicles. Such a system would provide power from an internal combustion engine that substantially reduces the need for fossil fuels that create unnecessary $CO_2$ emissions.

SUMMARY OF THE INVENTION

The present disclosure provides a system for converting motor vehicle waste heat into useful energy. The system has a motor vehicle having a vehicle electrical system, a heat source, and at least one passive electromotive force (EMF) generator. The heat source has an exhaust stream and the at least one passive EMF generator generates an EMF when the passive EMF generator is operably and fluidly coupled to the exhaust stream. At least a portion of the EMF is operatively and electrically coupled to an input of the vehicle electrical system of the motor vehicle.

DETAILED DESCRIPTION OF THE INVENTION

A system for converting motor vehicle waste heat to useful energy 100 (also called system 100 herein) generally described as comprising a heat source 300 generally in the form of an internal combustion engine, a passive electromotive force (EMF) generator 200 that utilizes waste heat generated by the heat source 300, and a voltage regulator 400. The various elements comprising the system for converting motor vehicle waste heat to useful energy 100 will be discussed individually infra.

Figure 3:
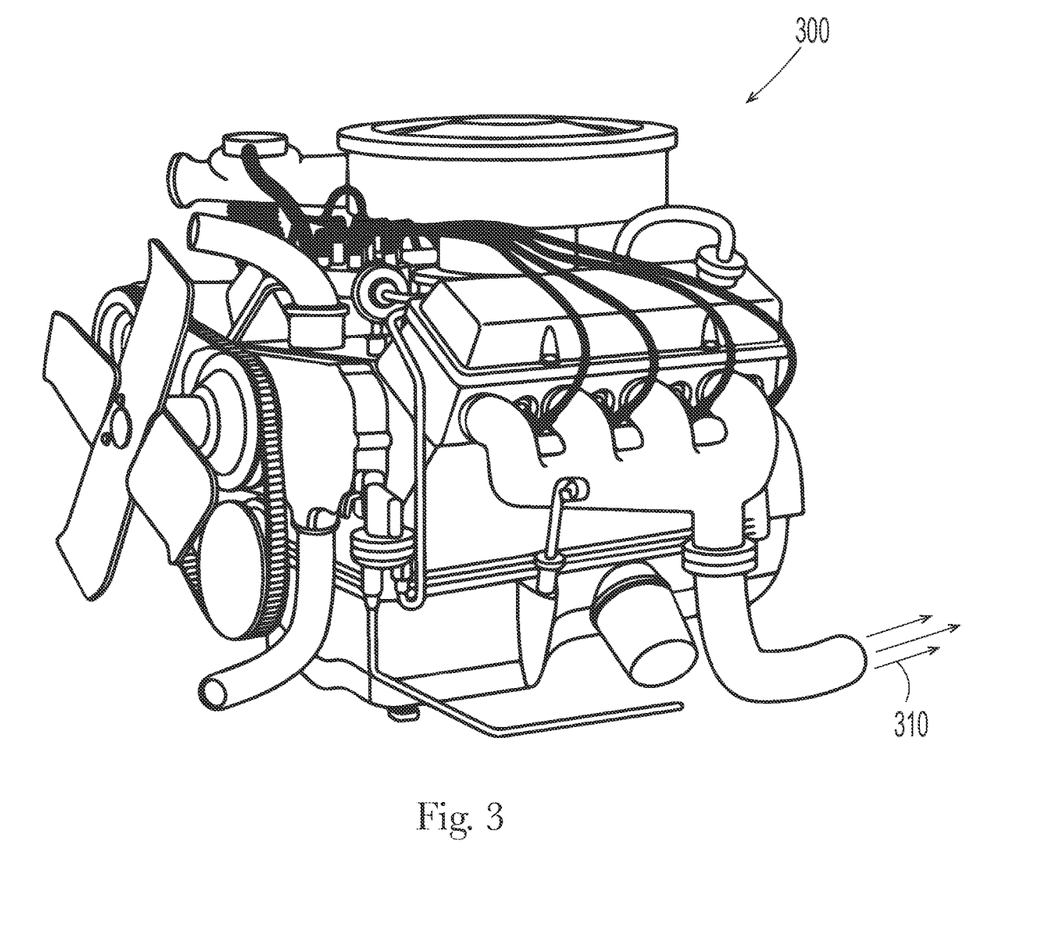
FIG. 3 is a perspective view of an exemplary heat source suitable for use with the present disclosure.

Referring to FIG. 3 an exemplary heat source 300 can be provided in the form of an electrical/gasoline-type ignition system (that can also run on other fuels (diesel, jet, and the like as previously mentioned) generally rely on a combination of a lead-acid battery and an induction coil to provide a high voltage electrical spark to ignite the air-fuel mix in the engine's cylinders. This battery can be recharged during operation using an electricity-generating device, such as an alternator or generator driven by the engine. Gasoline engines take in a mixture of air and gasoline and compress to less than 170 psi and use a spark plug to ignite the mixture when it is compressed by the piston head in each cylinder.

Alternatively, an exemplary heat source 300 can be provided in the form of a compression ignition system, such as the diesel engine and HCCI (Homogeneous Charge Compression Ignition) engines, rely solely on heat and pressure created by the engine in its compression process for ignition. Compression that occurs is usually more than three times higher than a gasoline engine. Diesel engines will take in air only, and shortly before peak compression, a small quantity of diesel fuel is sprayed into the cylinder via a fuel injector that allows the fuel to instantly ignite. HCCI type engines will take in both air and fuel but will continue to rely on an unaided auto-combustion process due to higher pressures and heat. This is also why diesel and HCCI engines are also more susceptible to cold starting issues though they will run just as well in cold weather once started. Most diesels also have battery and charging systems however this system is secondary and is added by manufacturers as luxury for ease of starting, turning fuel on and off which can also be done via a switch or mechanical apparatus, and for running auxiliary electrical components and accessories. Most modern diesels, however, rely on electrical systems that also control the combustion process to increase efficiency and reduce emissions.

Still another exemplary heat source 300 can be provided in the form of a jet engine (also called a gas turbine). A jet engine draws air in at the front with a fan. A compressor raises the pressure of the air. The compressor is made with many blades attached to a shaft. The blades spin at high speed and compress or squeeze the air. The compressed air is then sprayed with fuel and an electric spark lights the mixture. The burning gases expand and blast out through the nozzle, at the back of the engine. As the jets of gas shoot backward, the engine is thrust forward. As the hot air is going to the nozzle, it passes through another group of blades called the turbine. The turbine is attached to the same shaft as the compressor. Spinning the turbine causes the compressor to spin.

Regardless of the type of system used as heat source 300, once successfully ignited and burnt, the combustion products 310, in the form of hot gas, has more available energy than the original compressed fuel/air mixture (which had higher chemical energy). The available energy is manifested as high temperature and pressure that can be translated into work by the engine. In a reciprocating engine, the high pressure product gases inside the cylinders drive the engine's pistons.

Once the available energy has been removed, the remaining combustion products 310, including hot gases, are vented (often by opening a valve or exposing the exhaust outlet) and this allows the piston to return to its previous position (Top Dead Center—TDC). The piston can then proceed to the next phase of its cycle, which varies between engines. Any heat not translated into work is normally considered a waste product and is removed from the engine.

The major products of the complete combustion of petroleum-based fuels in an internal combustion engine provided for heat source 300 are carbon dioxide (13%), water (13%), nitrogen from air (73%), and significant amounts of waste heat. In internal combustion engines, generally only 25% of the fuel energy is converted into useful power output and approximately 40% of it is lost in exhaust heat. Temperature of engine exhaust can range from about 300° C. to 500° C. The combustion products 310 (also called exhaust product stream 310 herein) from a typical internal combustion engine is usually vented away from the engine through elongate piping (i.e., an exhaust pipe 320).

Exemplary vehicles 150 suitable for use, and consistent, with the present disclosure and incorporating a suitable heat source 300 can include, but not be limited to, semi-trucks, automobiles, tractors, ships, boats, airplanes, turbines, and the like.

Figure 4:
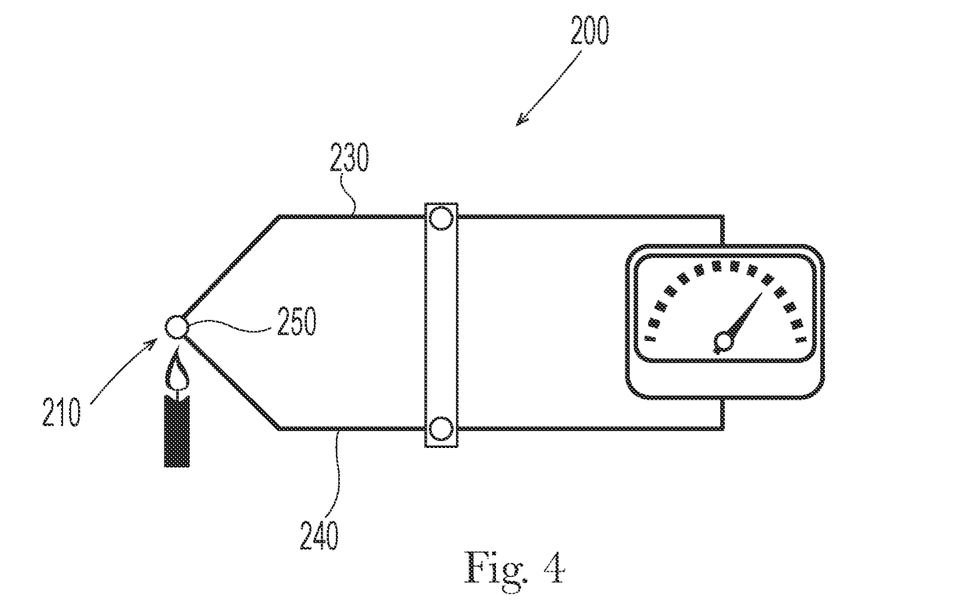
FIG. 4 is a schematic drawing of an exemplary passive electromotive force (EMF) generator in the form of a thermocouple.

Referring to FIG. 4, a non-limiting embodiment of a passive electromotive force (EMF) generator 200 can be provided as a form of thermocouple 210. As used herein, a 'passive EMF generator' is a device that is capable of generating an EMF without the need for moving parts or externally-applied power to generate an EMF. This is opposed to an active EMF generator, such as a typical engine alternator, discussed supra, having movable parts such as pulleys, bearings, rotating shafts, etc.

An exemplary passive electromotive force (EMF) generator 200 can be provided as a thermocouple 210. A thermocouple 210 is an electrical device consisting of two dissimilar electrical conductors 230, 240 that form an electrical junction 250. A thermocouple 210 produces a temperature-dependent voltage as a result of the Seebeck effect. The Seebeck effect refers to the development of an EMF across two points of an electrically conducting material when there is a temperature difference between those two points. In other words, one of skill in the art will understand that a thermo-electric current results when a magnetic needle is held near a circuit made of two electrical conductors 230, 240 and the dissimilar metal electrical junction 250 is heated.

In use herein, the voltage (EMF) generated at a single electrical junction 250 of two different two electrical conductors 230, 240 is what is of interest. The magnitude of the voltage depends on the types of wire being used for the two electrical conductors 230, 240 and the temperature that the electrical junction 250 is subjected to. In some circumstances, the voltage can be in the microvolt range. However, it was found that considerable voltages could be developed by using a plurality of thermocouples 210 (in the form of a thermopile 220) each connected in series, were of the correct configuration, and were subjected to combustion exhaust gasses 310. It was surprisingly found that, when properly designed, significant amounts of power (EMF) can be generated by a thermocouple 210 junctions and thermopile 220 configurations.

As is known, thermocouples 210 are widely used in science and industry. For example, thermocouples 210 are widely used as temperature sensors. Commercial thermocouples 210 are inexpensive and interchangeable. Thermocouples 210 are also used in homes, offices and businesses as the temperature sensors in thermostats, and also as flame sensors in safety devices for gas-powered appliances.

The metal alloys chosen as thermocouple 210 positive and negative leg wires (i.e., two electrical conductors 230, 240) define the type of thermocouple 210. One of skill in the art can select the proper thermocouple 210 type for a particular application and is typically determined by temperature expectations and by the environment in which the thermocouple 210 will be placed. Popular generic and trade names for the most common thermocouple 210 type wire combinations follow, as well as typical applications and limitations can include, but not be limited to: type K (Chromel®/Alumel® Temp. Range: (0 to 1260°) C. [32 to 2300]° F.), type J (Iron/Constantan Temp. Range: (0 to 760°) C. [32 to 1400]° F.), type T (Copper/Constantan Temp. Range: (−200 to 370°) C. [−328 to 700]° F.), type E (Chromel®/Constantan Temp. Range: (0 to 870°) C. [32 to 1600]° F.), type N (Nicrosil®/Nisil® Temp. Range: (0 to 1260°) C. [32 to 2300]° F.), type S (Platinum/Platinum (10% Rhodium) Temp. Range: (538 to 1481°) C. [1000 to 2700]° F.), type R (Platinum/Platinum (13% Rhodium) Temp. Range: (538 to 1481°) C. [1000 to 2700]° F.), and type B (Platinum (6% Rhodium)/Platinum (30% Rhodium) Temp. Range: (871 to 1704°) C. [1600 to 3100]° F.).

Figure 5:
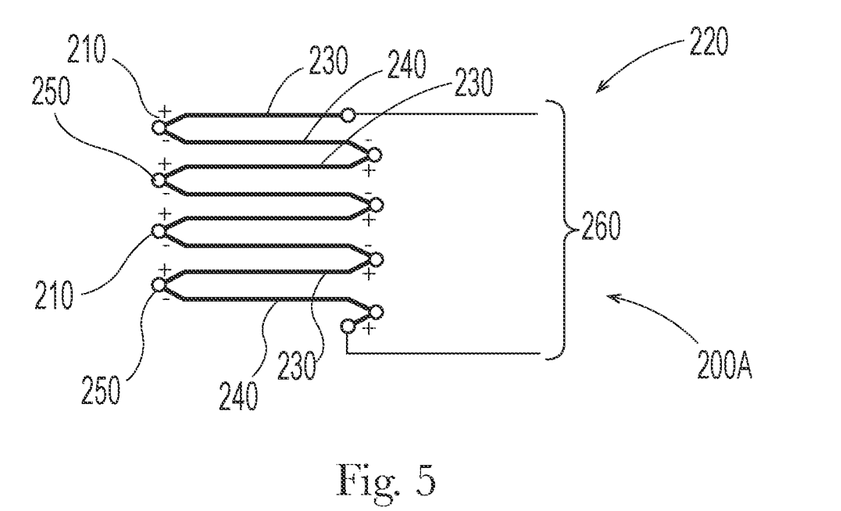
FIG. 5 is a schematic drawing of an exemplary passive electromotive force (EMF) generator in the form of a thermopile.

Referring to FIG. 5, a passive electromotive force (EMF) generator 200A can be provided as a form of a plurality of thermocouples 210, also known as a thermopile 220. As used herein, a 'thermopile' is used as a passive electromotive force (EMF) generator 200 to generate electrical energy that results from the combustion process. The process is an example of the Peltier effect (electric current transferring heat energy) as the process transfers heat from the hot to the cold junctions.

It will be appreciated that a thermopile 220 is a passive electronic device that converts thermal energy into electrical energy. A thermopile 220 is comprised of a plurality of thermocouples 210 that connected usually in series or, less commonly, in parallel. Such a device works on the aforementioned principle of the Seebeck thermoelectric effect—generating a voltage when its dissimilar metals (thermocouples 210) are exposed to a temperature difference.

As explained supra, thermocouples 210 operate by measuring the temperature differential from the electrical junction 250 point to the point in which the thermocouple 210 output voltage is measured. Once a closed circuit is made up of dissimilar electrical conductors 230, 240 and there is a difference in temperature between the electrical junctions 250 and points of transition from one electrical conductor 230, 240 to another, a current is produced as if it were generated by a difference of potential between the hot and cold junction.

Thermocouples 210 can be connected in series as thermocouple pairs with an electrical junction 250 located on either side of a thermal resistance layer. The output 260 from the thermocouple 210 pair will be a voltage that is directly proportional to the temperature difference across the thermal resistance layer and also to the heat flux through the thermal resistance layer. Adding more thermocouple 210 pairs in series increases the magnitude of the voltage output. Thermopiles 220 can be constructed with a single thermocouple pair, composed of at least two thermocouple 210 junctions, or a plurality of thermocouple 210 pairs (3 pairs, 4 pairs, 6 pairs, 10 pairs, 20 pairs, and the like). One of skill in the art will recognize that the selection of the number of thermocouple 210 pairs can be decided by the desired voltage output 260. By way of example only, if a high output voltage is required, one of skill in the art may decide to utilize a correspondingly high number of thermocouple pairs 210 to form thermopile 220.

Thermopiles 220 do not respond to an absolute temperature, but generate an output voltage 260 proportional to a local temperature difference or temperature gradient. The amount of voltage and power can be milli-watts and milli-volts, or watts and volts. This amount can be suitable for use with control devices that are specifically designed for such purpose.

Figure 6:
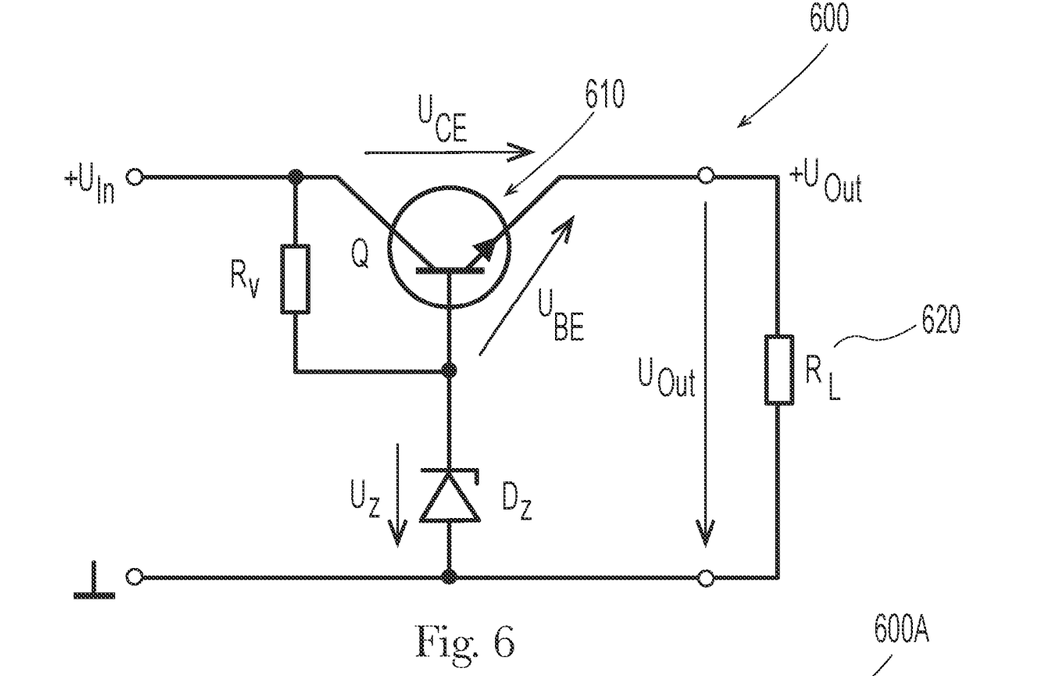
FIG. 6 is a schematic drawing of an exemplary voltage regulator.
Figure 7:
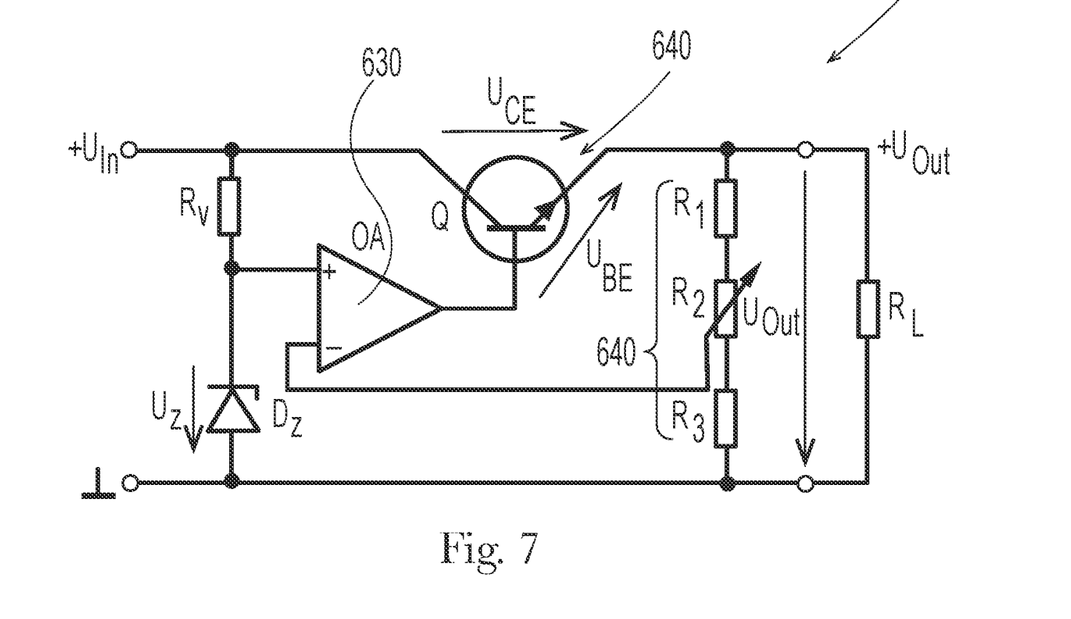
FIG. 7 is a schematic drawing of another exemplary voltage regulator.

Referring to FIGS. 6 and 7, the voltage developed by the exemplary thermocouples and/or thermopiles discussed supra can be converted and regulated by an exemplary voltage regulator 600, 600A. One of skill in the art will understand that a voltage regulator 600, 600A is a system designed to automatically maintain a constant voltage. A voltage regulator 600, 600A may use a simple feed-forward design or may include negative feedback. It may use an electro-mechanical mechanism, or electronic components. Depending on the design, it may be used to regulate one or more AC or DC voltages.

Referring to FIG. 6, a simple voltage/current regulator 600 can be made from a resistor in series with a diode (or series of diodes). When precise voltage control and efficiency are not important, this design may be fine. Since the forward voltage of a diode is small, this kind of voltage regulator 600 can be suitable for low voltage regulated output. When higher voltage output is needed, a zener diode or series of zener diodes may be used. Zener diode regulators make use of the zener diode's fixed reverse voltage, which can be quite large.

Feedback voltage regulators operate by comparing the actual output voltage to some fixed reference voltage. Any difference is amplified and used to control the regulation element in such a way as to reduce the voltage error. This forms a negative feedback control loop; increasing the open-loop gain tends to increase regulation accuracy but reduce stability. One of skill in the art will recognized that stability is avoidance of oscillation, or ringing, during step changes. There will also be a trade-off between stability and the speed of the response to changes. If the output voltage is too low (perhaps due to input voltage reducing or load current increasing), the regulation element is commanded, up to a point, to produce a higher output voltage—by dropping less of the input voltage (for linear series regulators and buck switching regulators), or to draw input current for longer periods (boost-type switching regulators). If the output voltage is too high, the regulation element will normally be commanded to produce a lower voltage.

One of skill in the art will recognize an exemplary voltage regulator 600 can be provided as a common collector amplifier. The simple transistor 610 regulator can provide a relatively constant output voltage $U_{out}$ for changes in the voltage $U_{in}$ of the power source and for changes in load, $R_L$, 620, provided that $U_{in}$ exceeds $U_{out}$ by a sufficient margin and that the power handling capacity of the transistor 610 is not exceeded. If the output voltage drops for any external reason, such as an increase in the current drawn by the load 620, the transistor's 610 base-emitter voltage ($U_{BE}$) increases, turning the transistor 610 on further and delivering more current to increase the load voltage again.

As shown in FIG. 7, the stability of the output voltage can be significantly increased by using an operational amplifier 630. In this case, the operational amplifier 630 drives the transistor 640 with more current if the voltage at its inverting input drops below the output of the voltage reference at the non-inverting input. Using the voltage divider 640 ($R_1$, $R_2$ and $R_3$) allows choice of the arbitrary output voltage between $U_z$ and $U_{in}$.

Figure 8:
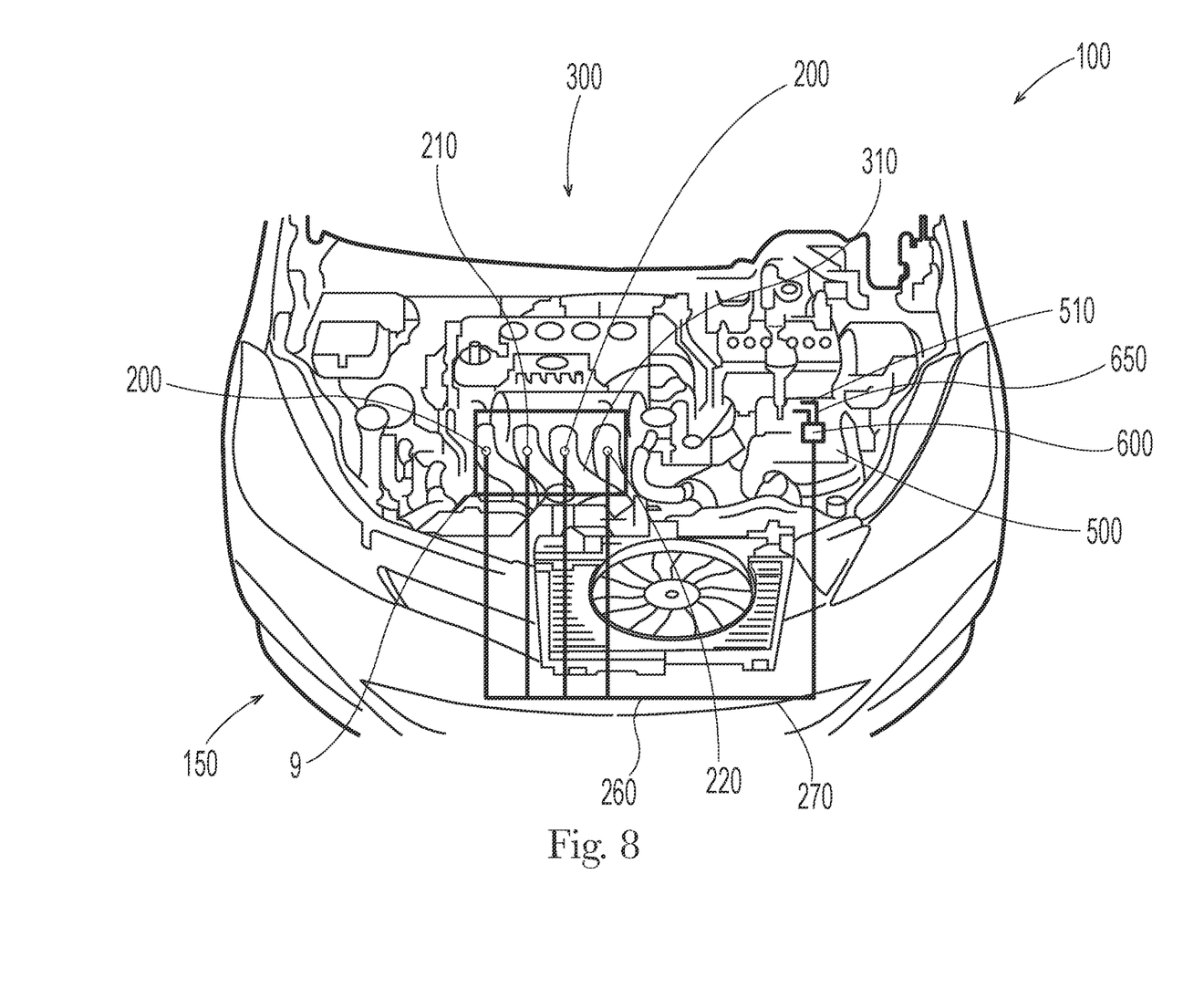
FIG. 8 is a perspective drawing of an exemplary system for converting motor vehicle waste heat to useful energy; and, FIG. 9 is an expanded view of the region labelled 9 in FIG. 8.

FIG. 8 depicts an exemplary, but non-limiting, embodiment of a system for converting motor vehicle waste heat to useful energy 100. The system for converting motor vehicle waste heat to useful energy 100 incorporates the use of an exemplary, but non-limiting, motor vehicle 150 provided with an exemplary, but non-limiting, heat source 300 (such as an internal combustion engine) cooperatively coupled thereto and at least one passive electromotive force (EMF) generator 200 disposed in cooperative coupling with combustion products 310 exhausted therefrom. The at least one passive electromotive force (EMF) generator 200 is matingly and cooperatively disposed in, and coupled to, the heat source 300. The at least one passive electromotive force (EMF) generator 200 operates to utilize the waste heat by-products disposed within the combustion products 310 exhausted from the heat source 300 to produce an EMF suitable for operating at least a portion of any vehicle electrical systems 500 cooperatively associated with the motor vehicle 150 and/or the heat source 300.

In one non-limiting embodiment, the system for converting motor vehicle waste heat to useful energy 100 can incorporate the use of a voltage regulator 600 in electrical communication with the output 260 of the at least one passive electromotive force (EMF) generator 200 and/or the input 510 of a/the vehicle electrical system(s) 500 to moderate and control the EMF (voltage) present at the thermocouple output 260 produced by the passive electromotive force (EMF) generator 200 into a range suitable for the efficient operation of the vehicle electrical systems 500. The output 650 of voltage regulator 600 can be provided in cooperative electrical communication with the input 510 of any vehicle electrical system 500.

In one non-limiting example of the present disclosure, the motor vehicle 150 suitable for use with the can include, but not be limited to, trucks, automobiles, ships, aircraft, submarines, balloons, dirigibles, rockets, and the like.

The system for converting motor vehicle waste heat to useful energy 100 can also incorporate the use of a heat source 300 in the form of an internal combustion engine disposed within a motor vehicle 150 that is used to provide a motive force to the motor vehicle 150. One of skill in the art will appreciate that most a motor vehicle 150 utilize gasoline- and diesel-powered fuel internal combustion engines. However, one of skill in the art will understand that gasoline-powered internal combustions engines, steam engines and the like are suitable for use as a motor vehicle 150 suitable for moving a motor vehicle 150.

Figure 9:
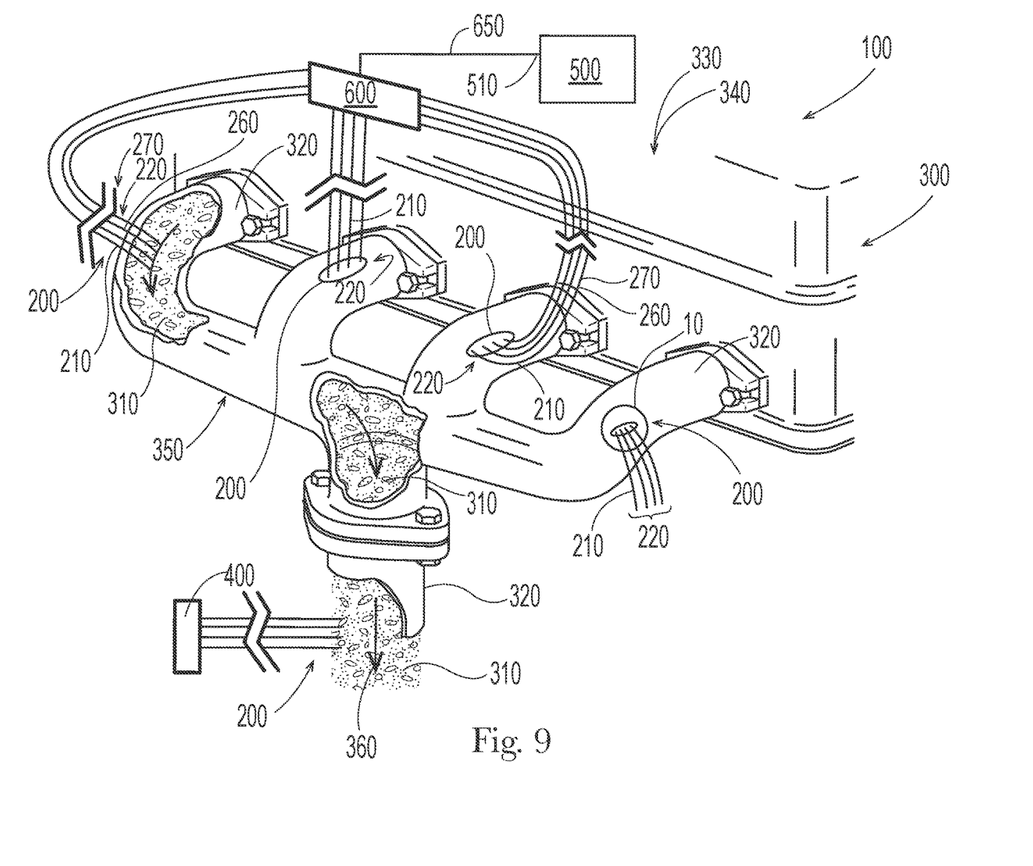

Referring to FIG. 9, as discussed supra, an exemplary heat source 300 will provide for, and support, the mixture and combustion of a fuel 330 (typically a hydrocarbon-based fuel) with air 340 (generally comprising oxygen and nitrogen). After combustion of the fuel 330, the products of combustion 310 (also referred to as combustion by-products 310 herein) are exhausted from heat source 300 to the atmosphere via exhaust pipe 320.

One of skill in the art will appreciate that spark-ignition gasoline and compression-ignition diesel engines differ in how they supply and ignite the fuel 330. In a spark-ignition engine, the fuel 330 is mixed with air 340 and then inductively conveyed into the engine cylinder during the intake process. After the piston compresses the fuel-air mixture, the spark ignites it, causing combustion. The expansion of the exhaust gas comprising the products of combustion 310 push the piston during the power stroke. In a diesel engine, only air 340 is inducted into the engine and then compressed. Diesel engines then spray the fuel 330 into the hot compressed air 340 at a suitable, measured rate, causing it to ignite.

The exhaust gas, or flue gas, is emitted as a result of the combustion of fuels 330 such as natural gas, gasoline (petrol), diesel fuel, fuel oil, biodiesel blends, or coal. According to the type of engine, it is discharged into the atmosphere through an exhaust pipe 320 (also called a flue gas stack, or propelling nozzle) that is fluidly coupled to heat source 300 via manifold 350. The largest part of the products of combustion 310 include, but are not limited to, nitrogen ($N_2$), water vapor ($H_2O$) (except with pure-carbon fuels), carbon dioxide ($CO_2$), and significant amounts of heat.

One of skill in the art will appreciate that a heat source 300 suitable for use with vehicle 150 can be include any type of heat source utilized in the propulsion of vehicles. This can include thermal engines (e.g., internal combustion engines, external combustion engines (e.g., steam engines, Stirling engines, liquid organic Rankine cycle engines, and the like), reaction engines (e.g., jet engines and rocket engines), combinations thereof, and the like. Further, one of skill in the art will recognize that a heat source 300 (engine) can be incorporated into a plurality of vehicles that may be required to generate motive forces. This can include, but not be limited to, trucks, automobiles, ships, aircraft, submarines, balloons, dirigibles, rockets, turbines, and the like.

Referring again to FIG. 9, the combustion products 310 can be provided as an exhaust fluid stream 360 fluidly routed away from heat source 300 though manifold 350 and exhaust pipe 320 having an overall length, L, and vented to the atmosphere. At least one passive electromotive force (EMF) generator 200 is disposed within the exhaust pipe 320 or even manifold 350 and in contacting and fluid engagement with the combustion products 310 emitted from heat source 300 in exhaust fluid stream 360. In one embodiment, the at least one passive EMF generator 200 is provided as at least one thermocouple 210. In yet another embodiment, passive EMF generator 200 can be provided as at least two thermocouples 210. In yet another embedment, passive EMF generator 200 is provided as a thermopile 220 comprising a plurality of thermocouples 210. In yet still another embodiment, passive EMF generator 200 can be provided as a plurality of thermopiles 220, each comprising a plurality of thermocouples 210. In still yet another embodiment, a plurality of thermopiles 220 can each be disposed along the length, L, of the exhaust pipe 320 extending from the manifold 350 to the atmosphere.

In any regard, one of skill in the art will understand that a plurality of thermocouples 210 and/or thermopiles 220 can each be consecutively disposed along manifold 350 and/or exhaust pipe 330 and efficaciously disposed within combustion products 310 disposed in fluid exhaust stream 360. One of skill in the art will appreciate that the temperature (i.e., heat) of combustion products 310 would be higher in a region proximate to the connection of heat source 300 to manifold 350. As the combustion products 310 disposed in exhaust fluid stream 360 continuously flow through manifold 350 and exhaust pipe 320, the temperature decreases. Therefore, one of skill in the art would recognize that the placement of passive EMF generator 200 proximate to the region proximate to the connection of heat source 300 to manifold 350 could necessarily realize an increase in EMF output by passive EMF generator 200. However, without desiring to be bound by theory, it is believed that the sequential placement of passive EMF generators 200 along the length of manifold 350 and/or exhaust pipe 320 can result in significant EMF output by passive EMF generator 200. Further, one of skill will recognize that increasing the number of passive EMF generators 200 disposed in contact with the combustion products 310 disposed in exhaust fluid stream 360 or in contacting engagement with a surface of exhaust pipe 320 can increase the amount of EMF generated substantially.

Each passive EMF generator 200 employed by the system for converting motor vehicle waste heat to useful energy 100 is capable of generating an EMF due to the fluid engagement with the combustion products 310 routed away from heat source 300 though manifold 350/exhaust pipe 320. One of skill in the art will appreciate that the EMF generated by each passive EMF generator 200 can be directed to any system electrically coupled to the vehicle 150 used by the system for converting motor vehicle waste heat to useful energy 100. Such systems can be used to provide at least a portion of the EMF utilized to operate a system operatively coupled to, and/or electrically coupled to, the input 510 of the vehicle electrical systems 500 of vehicle 150. This can include exemplary, but non-limiting, systems such as the engine, fuel systems, transmission systems, electrical systems, cooling and lubrication systems, the chassis, suspension systems, braking systems, wheels and tires, the vehicle body, auxiliary systems, combinations thereof, and the like. One of skill in the art will appreciate that the EMF generated by passive EMF generators 200 can be used by any vehicle utilizing a heat source 300 to provide motive force. This can include automobiles, airplanes, busses, boats, trains, and the like.

Referring yet again to FIGS. 8 and 9, the EMF 270 generated by passive EMF generator 200, can be directed to an optional voltage regulator 600 provided in operable, cooperative, and electrical communication with the thermocouple output 260 of the at least one passive EMF generator 200. As discussed supra, one of skill in the art will understand that the EMF 270 generated by passive EMF generator 200 can be conditioned, transformed, or otherwise modified by voltage regulator 600 into a form suitable for the desired application and/or output. By way of non-limiting example, voltage regulator 600 can transform the EMF 270 generated by passive EMF generator 200 to a voltage (e.g., a 'standard' 12 VDC) suitable for use by vehicle 150 and/or any systems operably, cooperatively, and electrically associated thereto as described supra. Alternatively, the EMF 270 generated by passive EMF generator 200 can be conditioned, transformed, or otherwise modified by voltage regulator 600 into a voltage and or current output 650 suitable for use by the vehicle 150. Yet still, the EMF 270 generated by passive EMF generator 200 can be conditioned, transformed, or otherwise modified by voltage regulator 600 into a voltage and or current 650 suitable for use by any device that may require EMF for operation.

Any dimensions and/or values disclosed herein are not to be understood as being strictly limited to the exact numerical values recited. Instead, unless otherwise specified, each such dimension and/or value is intended to mean both the recited dimension and/or value and a functionally equivalent range surrounding that dimension and/or value. For example, a dimension disclosed as "40 mm" is intended to mean "about 40 mm."

Every document cited herein, including any cross referenced or related patent or application and any patent application or patent to which this application claims priority or benefit thereof, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests, or discloses any such invention. Further, to the extent that any meaning or definition of a term in this document conflicts with any meaning or definition of the same term in a document incorporated by reference, the meaning or definition assigned to that term in this document shall govern.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A system for converting motor vehicle waste heat into useful energy comprising:
   a motor vehicle comprising a vehicle electrical system;
   said motor vehicle further comprising a heat source;
   said heat source comprising a plurality of exhaust streams;
   a manifold comprising a plurality of inputs mechanically and fluidly connected to a single output, each of said plurality of inputs being fluidly coupled to a respective exhaust stream of said plurality of exhaust streams, each of said plurality of exhaust streams being fluidly communicated from said heat source to said manifold through each of said respective inputs;
   an exhaust pipe operatively and mechanically coupled to said output of said manifold, said exhaust pipe fluidly communicating said exhaust stream from said manifold, through said exhaust pipe, to atmosphere;
   a first plurality of passive electromotive force (EMF) generators, a respective passive electromotive force (EMF) generator of said first plurality of passive electromotive force (EMF) generators disposed within each of said plurality of inputs of said manifold and in at least a portion of said exhaust streams, each of said passive EMF generators generating a first EMF when at least a portion of said plurality of passive EMF generators is disposed in, said respective exhaust streams, wherein each of said first plurality of passive EMF generators is a thermopile;
   a first voltage regulator, each passive EMF generator of said first plurality of passive EMF generators being in electrical communication with said first voltage regulator such that said first EMF generated by each respective passive EMF generator of said first plurality of passive EMF generators is electrically communicated to said first voltage regulator, said first voltage regulator transforming said first EMF collectively generated by each respective passive EMF generator of said first plurality of passive EMF generators to a voltage suitable for use by said vehicle electrical system of said motor vehicle; a secondary passive EMF generator disposed within said exhaust pipe and said exhaust stream disposed therein, said secondary passive EMF generator generating a second EMF when said secondary passive EMF generator is disposed in said exhaust stream disposed within said exhaust pipe; and,
   wherein a portion of said first EMF is operatively and electrically coupled to an input of said vehicle electrical system of said motor vehicle.

2. The system for converting motor vehicle waste heat into useful energy of claim 1 wherein all of said first EMF is operatively and electrically coupled to said input of said vehicle electrical system of said motor vehicle.

3. The system for converting motor vehicle waste heat into useful energy of claim 1 wherein said voltage regulator is a feed-forward voltage regulator.

4. The system for converting motor vehicle waste heat into useful energy of claim 1 wherein said voltage regulator is a negative feedback voltage regulator.

5. The system for converting motor vehicle waste heat into useful energy of claim 1 wherein each of said respective passive electromotive force (EMF) generators of said first plurality of passive electromotive force (EMF) generators is disposed completely in said exhaust stream.

6. The system for converting motor vehicle waste heat into useful energy of claim 1 wherein said thermopile is formed from a plurality of thermocouples, each of said thermocouples being selected from the group consisting of type K thermocouples, type J thermocouples, type T thermocouples, type E thermocouples, type N thermocouples, type S thermocouples, type R thermocouples, type B thermocouples, and combinations thereof.

7. The system for transporting perishable goods of claim 1 wherein said heat source is selected from the group consisting of thermal engines, external combustion engines, reaction engines, and combinations thereof.

8. The system for converting motor vehicle waste heat into useful energy of claim 1 wherein said vehicle is selected from the group consisting of semi-trucks, trucks, automobiles, tractors, ships, busses, boats, aircraft, trains, submarines, balloons, dirigibles, rockets, and turbines.

9. The system for converting motor vehicle waste heat into useful energy of claim 1 wherein said vehicle electrical system is electrically coupled to a vehicle system, said vehicle system selected from the group consisting of an engine, fuel systems, transmission systems, electrical systems, cooling and lubrication systems, the chassis, suspension systems, braking systems, wheels and tires, vehicle body, auxiliary systems, and combinations thereof.

10. The system for converting motor vehicle waste heat into useful energy of claim 1 wherein said heat source is an engine selected from the group consisting of gasoline engines, diesel engines, steam engines, and jet engines.

11. The system for converting motor vehicle waste heat into useful energy of claim 1 wherein said second EMF is electrically communicated to said first voltage regulator.

12. The system for converting motor vehicle waste heat into useful energy of claim 1 wherein said second EMF is electrically communicated to a second voltage regulator.

13. The system for converting motor vehicle waste heat into useful energy of claim 12 wherein a portion of said second EMF is operatively and electrically coupled to said input of said vehicle electrical system of said motor vehicle.

14. The system for converting motor vehicle waste heat into useful energy of claim 13 wherein all of said second EMF is operatively and electrically coupled to said input of said vehicle electrical system of said motor vehicle.

15. The system for converting motor vehicle waste heat into useful energy of claim 1 wherein said secondary passive EMF generator is a thermocouple.

16. The system for converting motor vehicle waste heat into useful energy of claim 1 wherein said secondary passive EMF generator is a thermopile.

* * * * *